United States Patent
Passiopoulos et al.

(10) Patent No.: US 7,034,633 B2
(45) Date of Patent: Apr. 25, 2006

(54) COUPLING DEVICE USING BURIED CAPACITORS IN MULTILAYERED SUBSTRATE

(75) Inventors: George Passiopoulos, London (GB); Sarmad Al-Taei, Swansea (GB); Mahmoud Zadeh, Teddington (GB); Kevin Lamacraft, Twickham (GB); Phil Lane, St. Albans (GB)

(73) Assignee: Nokia Corporation, Espoo (FI)

( * ) Notice: Subject to any disclaimer, the term of this patent is extended or adjusted under 35 U.S.C. 154(b) by 79 days.

(21) Appl. No.: 10/469,074

(22) PCT Filed: Feb. 28, 2001

(86) PCT No.: PCT/EP01/02249

§ 371 (c)(1),
(2), (4) Date: Feb. 10, 2004

(87) PCT Pub. No.: WO02/069440

PCT Pub. Date: Sep. 6, 2002

(65) Prior Publication Data

US 2004/0113717 A1    Jun. 17, 2004

(51) Int. Cl.
*H01P 5/18* (2006.01)

(52) U.S. Cl. .................................... 333/116; 333/112

(58) Field of Classification Search ............... 333/109, 333/115, 116, 26, 112

See application file for complete search history.

(56) References Cited

U.S. PATENT DOCUMENTS

| 3,593,208 A | 7/1971 | Smith ..................... 333/112 |
| 5,281,929 A | 1/1994 | Willems ................. 333/116 |
| 5,382,925 A * | 1/1995 | Hayashi et al. ........ 333/112 |
| 5,745,017 A | 4/1998 | Ralph .................... 333/116 |
| 6,819,200 B1 * | 11/2004 | Zhao et al. ............. 333/26 |

FOREIGN PATENT DOCUMENTS

EP    1 003 216 A2    5/2000

OTHER PUBLICATIONS

Wadell, Brian C., *"Transmission Line Design Handbook"*, Artech House Publishers, 1991.

* cited by examiner

*Primary Examiner*—Dean Takaoka
(74) *Attorney, Agent, or Firm*—Squire, Sanders & Dempsey, L.L.P.

(57) ABSTRACT

The present invention proposes a coupling device, comprising a substrate (1), a conductive layer (2) covering a first surface of said substrate (1), at least two electromagnetically coupled lines (3a, 3b) being provided opposite to said first surface and at least one thereof being covered by at least one cover layer (4, 5) wherein at least one capacitor (C1, C2, C3, C4) is connected between a first end of at least one of said at least two lines (3a, 3b) and said conductive layer (2). The at least one capacitor is a buried capacitor grounded in order to equalize unequal phase velocities otherwise degrading the performance of e.g. broadside coupled structures in an inhomogeneous substrate structure such as for example microstrips in a multilayer LTCC. Therefore the present invention enables coupling devices having a high performance and offering in that way the best of all possible design scenarios in terms of wideband performance, size and cost.

11 Claims, 10 Drawing Sheets

COUPLING DEVICE USING BURIED CAPACITORS IN MULTILAYERED SUBSTRATE

FIELD OF THE INVENTION

The present invention relates to a coupling device. More particularly, the present invention relates to a coupling device obtainable from a multilayer integrated circuit technology fabrication process.

BACKGROUND OF THE INVENTION

Coupling devices (referred to as couplers) in general, such as for example Hybrid 3 dB couplers, are essential circuit components which are increasingly being used for high performance applications in such diverse circuits as RF mixers, amplifiers and modulators. In addition they can be used in a variety of other support functions such as the ones encountered in general RF signal and amplitude conditioning and error signal retrieval systems.

The expression "hybrid" in connection with couplers means an equal split of power between two (output) ports of the coupler with respect to an input port. Hence a 3 dB coupler is a "hybrid" since:

10 log($Power_{out}$/$Power_{in}$)=−3 dB $Power_{out}$/$Power_{in}$=$10^{(-3/10)}$=0.5

So the output power Powerout of one of the output ports is half (−3 dB) of the input power $Power_{in}$, the other half emerges from the other output port. If we consider FIG. 1 (to be explained in greater detail later on) and say that port P1 is the input port, then port P4 is said to be the coupled port and port P2 is said to be the direct port with half the input power being output from each of the output ports. Port P3 is said to be isolated from port P1. Note that the output at the coupled port will experience a phase shift dependent on the coupling length, while the output at the direct port will not experience a phase shift (with reference to the input supplied at the input port).

The use of couplers in the 1–5 GHz range though has been at the expense of large area of occupation required for such couplers and fabrication tolerance problems resulting from tight gap dimensioning for 3 dB coupling operation when implemented in PCB technology (PCB=Printed Circuit Board). More precisely, when implementing a coupler in PCB technology, it is necessary to accurately provide a gap between coupling lines of a coupler with the designed dimensions, since otherwise the coupler will not perform properly.

To address fabrication issues, narrow-band equivalents that compromise even more the size of the circuit such as branch line couplers have been utilized. Other alternatives such as SMD type (SMD=Surface Mounted Device) hybrid couplers have been used that offer better size ratios but are still quite large for future systems of small size with increased functionality. Often SMD component type couplers require additional external matching components to optimize their performance in terms of isolation and matching as well as amplitude and phase balance and therefore even further compromise the circuit area. Stated in other words, the provision of externally provided SMD components for matching purposes further increases the entire size of the coupler and requires additional soldering processes for soldering the externally provided SMD components. The increased use of SMD components increases costs and the use of soldering connections compromises the environmental friendliness and reduces the reliability of a manufactured subsystem module, since each solder connection represents a potentially source of errors.

Stripline technology has also been utilized for the design of high performance couplers but it suffers from the need to accommodate for larger volume/size for a given component inflicting additionally more materials costs.

Low loss performance can also be an issue especially in LNA designs (LNA=Low Noise Amplifier) as well as in high efficiency power amplification and linearisation applications. For such applications the dB on loss performance is a critical issue. Current designs offer typically 0.3 dB loss performance per coupler.

To rectify the above problems and address the performance requirements of future miniaturized circuit subsystems, wideband couplers in terms of isolation, matching and amplitude and phase balance are required that are additionally fabrication tolerance resistant and of much smaller size than its predecessors.

Size can be decreased by using an appropriate integration technology as well as a miniaturization circuit technique. Multilayer integrated circuits such as multilayer ceramic LTCC/HTCC (LTCC=Low Temperature Cofired Ceramics, HTCC=High Temperature Cofired Ceramics) technologies have been identified as a technology of great miniaturization potential since three dimensional design flexibility is combined with ceramic materials of high dielectric constant (∈). Loss performance is enabled by the careful choice of materials and circuit geometry as well as topology.

Isolation/matching and amplitude and phase balance performance can be optimized by using a suitable circuit technique or geometry.

FIG. 1 shows an equivalent circuit diagram of a conventionally known coupler. Basically, a coupling device consists of a pair of coupled lines 3a, 3b. Each line has two ports for inputting/outputting electrical and/or electromagnetic signals to be coupled. Thus, as shown in FIG. 1, the line 3a has ports P1, P2, while the line 3b has ports P3, P4. Each port P1 through P4 is terminated with a termination impedance $Z_0$. In a 50 Ohms system, the value of $Z_0$ is set to 50 Ohms. The lines 3a, 3b have equal length which is expressed in terms of the wavelength for which the coupler is designed. The parameter le° denotes the electric length of the coupler which is measured in degrees (°). For example, for the coupler shown in FIG. 1, the length is assumed to be $\lambda/4$, with $\lambda$ being the center frequency of operation for which the coupler is designed. Thus, in such a case, a signal fed to the coupler at port P1 and used as a reference is coupled to the port P4 (coupled port) with its phase shifted (indicated by "−90°"). Port P3 is isolated from port 1, which means that no power reaches port P3 from port P1. The signal at port P2 (the direct port) is not shifted with reference to the signal input at port P1 as indicated by 0°. Note that in case of a 3 dB coupler as an example, the power input at port P1 is split between ports P2 (direct port) and P4 (coupled port) Nevertheless, other line lengths such as $\lambda/2$, or odd multiples of $\lambda/4$ such as $3\lambda/4$ are possible. Also, the lines could have different lengths, while in such a case only the length of the lines over which the lines are facing each other represents an effective coupling length (electric length le in [°]). The coupler, i.e. the coupling lines, may be described in terms of the even and odd propagation modes of electromagnetic waves travelling there through and their respective characteristic impedances $Z_{oo}$, $Z_{oe}$ and phase velocities $\upsilon_{oe}$ and $\upsilon_{oo}$ and the electric length le of the coupling lines.

In 3 dB coupling in a 50 Ohms system, one needs to design the lines to have impedance values $Z_{oo}$ and $Z_{oe}$ of 20.7 and 120.7 Ohms respectively. The above arrangement though assumes equal phase velocities for the even and the odd modes i.e. $v_{oe}=v_{oo}$.

If the phase velocities of the two modes (even and odd mode) are unequal, then isolation and matching at the centre frequency of operation suffers. More precisely, the undesired unequal phase velocities are typical for all transmission lines that are not strictly TEM (Transverse-Electro-Magnetic), often referred to as Quasi-TEM transmission lines such as for example a microstrip line. This is invariably the case with most couplers that use a pair of microstrip lines.

The problem of unequal phase velocities could be prevented by the use of true TEM transmission lines such as coupled striplines. However, in such a case at least one extra metallization layer is required which is not desired in terms of costs, involved.

FIG. 7 shows in a rough outline the difference between a stripline and microstrip arrangement, respectively. The left hand portion of FIG. 7 shows a stripline arrangement, while the right hand portion shows a microstrip arrangement. It is an important property of any two-conductor lossless transmission lines (coupling lines) placed in a uniform dielectric substrate (homogeneous and/or symmetrical substrate) that it supports a pure TEM mode of propagation. A common example of these types of lines is STRIPLINE, as shown in FIG. 7, left portion. However if a transmission line is placed in an inhomogenous (and/or non-symmetric) dielectric substrate it can no longer support fully-TEM propagation because the electromagnetic wave now propagates mostly within the substrate, but some of the wave is now able to propagate in air also. The most common example of this is MICROSTRIP also shown in FIG. 7, right portion. Stripline couplers are encased in a homogenous substrate where the electromagnetic fields of the coupler are confined within the substrate by the two ground planes (conductive layers) While for a microstrip line its electromagnetic propagation takes place mainly within the substrate (in fact most of the power propagates within the substrate), but some of the power propagates outside the substrate which is usually air.

FIG. 2 shows a cross section of a coupler (in microstrip arrangement) as represented in FIG. 1, while FIG. 2 shows coupled lines on the surface (FIG. 2a) or embedded (FIG. 2b) within a substrate as alternative microstrip arrangement implementations.

As shown in FIG. 2(a), the coupling device comprises a substrate 1 made of a dielectric material of a dielectric constant $\epsilon_r$, a conductive layer 2 covering a first surface of said substrate 1 (the "bottom" side), and (at least) two lines 3a, 3b being provided electrically separated from each other at a second surface of said substrate 1 opposite to said first surface (the "top" side). Note that the same reference numerals as those used in FIG. 1 denote the like components such that a repeated explanation thereof is omitted. Said two lines 3a, 3b are laterally spaced apart from each other, with the amount of spacing (i.e. the width of a gap there between) adjusts the degree of electromagnetic coupling between said two lines. Although only two lines are shown, more than two lines may be used for coupling purposes dependent on the specific purpose for which the coupler is designed. Moreover, said conductive layer 2, in operation of the device, is connected to ground potential.

The coupler shown in FIG. 2(a) is generally known as an edge coupled coupling device, since coupling occurs between the elongated sides/edges in lengthwise direction of the lines facing each other (in a direction vertical to the drawing plane in FIG. 2(a)).

It is typical in such edge coupled microstrip line couplers that the odd mode velocity is higher than the even mode velocity i.e. $v_{oo}>v_{oe}$. Compensation techniques that improve isolation and matching and retain the amplitude and phase balance to good bandwidths have been dealt with previously. The main issue with these techniques is that such edge coupled couplers suffer from fabrication tolerances (gap dimension requirement such as small gap, constant over the entire length of the striplines), and therefore their use is not generally suggested.

The case when the even mode velocity is higher than the odd mode velocity (i.e. $v_{oe}>v_{oo}$) is a case that is encountered in the case of partially embedded broadside coupled microstrips (i.e. at least one coupling line being embedded).

Such a broadside coupled coupling device is illustrated in FIG. 2(b). Note that the same reference numerals as those used in FIG. 1 denote the like components such that a repeated explanation thereof is omitted. As shown, a broadside coupled coupling device comprises a substrate 1 made of a dielectric material of a dielectric constant $\epsilon_r$, a conductive layer 2 covering a first surface of said substrate 1 (the "bottom" side), (at least) two electromagnetically coupled lines 3a, 3b being provided opposite to said first surface and being covered by at least one cover layer 4, 5.

The (at least) two lines 3a, 3b are arranged at different distances from said first surface of said substrate 1, with a difference between the distances in which said two lines 3a, 3b are arranged from said first surface of said substrate 1 is determined by a thickness of a first cover layer 4 covering a first line 3b of said at least two lines. As shown in FIG. 2(b), the first line 3b and second line 3a of said two lines are arranged such that they fully overlap each other in the cross-sectional representation. Nevertheless, this is not absolutely required and it is sufficient that they at least partly overlap each other. The amount of overlap (and of course the distance between the lines in "vertical" direction within the substrate) adjusts the degree of electromagnetic coupling between said at least two lines. Such an overlap is illustrated in FIG. 3B.

A second cover layer 5 is arranged to cover at least the second line 3a of said two lines. This means that as shown, the second cover layer 5 also covers the first cover layer. However, this is not absolutely required, while from a viewpoint of simplified production nevertheless desirable. The at least one cover layer 4, 5 is for example of the same material as said substrate 1. Moreover, said conductive layer 2, in operation of the device, is connected to ground potential.

Note that the arrangement shown in FIG. 2(a) may additionally be covered with a cover layer (not shown) so that either an edge coupled buried coupling device is obtained in case the cover layer is a dielectric material (e.g. the same as the substrate material), or an edge coupled coated coupling device is obtained in case the cover layer is e.g. a resist pattern.

FIG. 3 shows a further arrangement of a coupling device. FIG. 3B shows a coupling device in cross section with at least partly overlapping coupling lines as mentioned herein above. FIG. 3A shows a top view and/or layout view of the coupling device shown in FIG. 3B. Ports P1 and P2 are interconnected by the coupling line 3a which is arranged above the coupling line 3b interconnecting ports P4 and P3.

Coupling line 3a and ports P1, P2 are illustrated in a differently hatched illustration as compared to coupling line 3b and ports P4 and P3.

Still further, the arrangements of FIGS. 2(a) and 2(b) and or FIG. 3 may be combined if e.g. more than two coupled lines are present in the coupling device. This means that for example edge coupled coupling lines may in turn be broadside coupled to one or more other coupling lines provided for in the arrangement.

Note also, that as the production technology for such devices, the multilayer integrated circuit technology which is assumed to be well known to those skilled in the art may be used so that a detailed description of the method for production of such devices is considered to be dispensable.

To the best of our knowledge there have not been suggested any techniques that compensates the velocity of the even and odd modes when the situation is encountered that the even mode velocity is higher than the odd mode velocity. Thus, in such a case, the above discussed problems inherent to coupling devices in connection with unequal phase velocities still remain.

SUMMARY OF THE INVENTION

Consequently, it is an object of the present invention to provide a coupling device which is free from such drawbacks inherent to coupling devices in connection with unequal phase velocities.

According to the present invention, this object is for example achieved by a coupling device, comprising a substrate, a conductive layer covering a first surface of said substrate, at least two electromagnetically coupled lines being provided opposite to said first surface and at least one of which lines being covered by at least one cover layer, wherein at least one capacitor is connected between a first end of at least one of said at least two lines and said conductive layer.

Advantageous further developments are as defined in the respective dependent claims.

Accordingly, a coupling device according to the present invention is proposed as a circuit technique that optimizes the coupler performance in terms of isolation and matching. This technique is particularly suited to a practical circuit topology that can be implemented in LTCC/HTCC technology while this topology is also suited for low loss performance and has increased miniaturization potential. As such both, i.e. size and performance can be optimized while the added performance can be used to trade off with any fabrication tolerances incurred during fabrication.

In addition, using the proposed technique all the performance properties can be retained over a wide bandwidth. The technique is also suited to multilayer IC (IC=Integrated Circuit) technologies such as the ones encountered for example in multilevel metal SiGe (Silicon-Germanium) and multilayer thin film processes. It should be noted though that the cost of implementing couplers in the 1–6 GHz region well justifies the use of multilayer ceramic integrated circuit technology (e.g. LTCC) as opposed to the significantly more expensive Si/GaAs (silicon/gallium arsenide) IC and thin film approaches.

The invention presents a signal coupling structure with a new (unequal phase velocity) compensation method applied in a multilayer structure. The unequal phase velocities of two coupled microstrip lines are compensated by using buried capacitors in the multilayer structure. In particular, the present invention is applicable to broadside coupled microstrips arrangements. Buried capacitors are added in order to compensate the unequal phase velocities related to two broadside coupled microstrip lines. After the phase velocities are compensated (i.e. the at least one capacitor is added), the phase velocities of the two modes are equal and therefore no forward coupling exists: Thus, the isolation is improved significantly.

As integrated in the multilayer ceramic substrate, this structure saves cost and size. Also, it increases the reliability, since no SMD components are required. Electrical performance, especially isolation, is enhanced by the use of the capacitors.

According to the present invention, a novel compensation technique has been suggested that among others enables the use of broadside coupled microstrip line components embedded in multilayer structures.

The technique effectively enables a design topology that though it offers structural convenience, miniature size and low loss performance, would otherwise suffer from low isolation and matching performance.

Therefore the present invention enables coupling devices having a high performance combined with the above advantages, offering in that way the best of all possible design scenarios in terms of wideband performance, size and cost.

The coupling device according to the present invention is particularly suitable for being used for high performance applications in such diverse circuits as RF mixers, amplifiers (e.g. low noise amplifiers LNA) and modulators. In addition it can be used in a variety of other support functions such as the ones encountered in general RF signal and amplitude conditioning and error signal retrieval systems.

BRIEF DESCRIPTION OF THE DRAWINGS

The above and other objects, features and advantages of the present invention will be more readily understood upon referring to the accompanying drawings, in which:

FIG. 6A shows a plot of measurement results for a conventional coupler, while

DETAILED DESCRIPTION OF THE EMBODIMENTS

Subsequently, the present invention will be described in detail with reference to the accompanying drawings.

Figure 4:
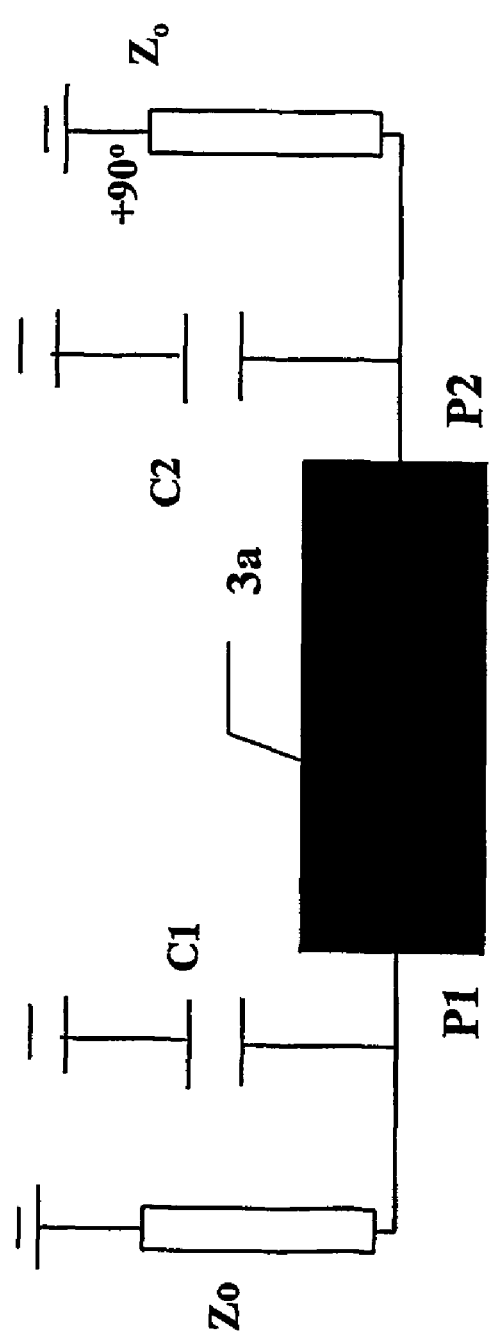
FIG. 4 shows an equivalent circuit diagram of a coupling device according to the present invention.
Figure 4:
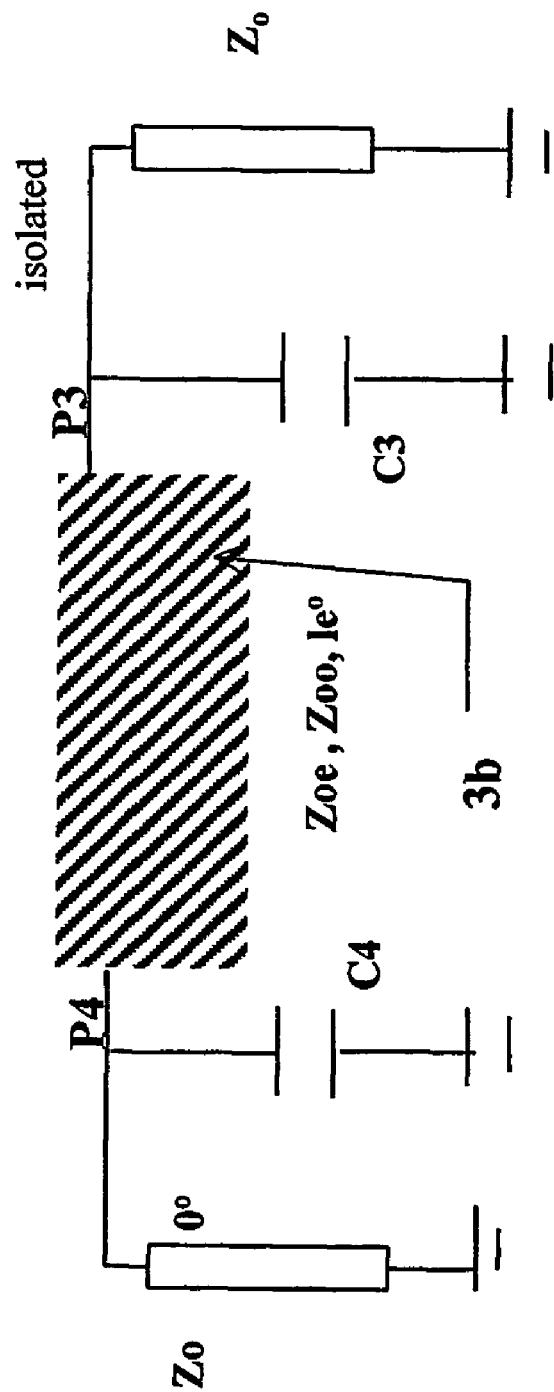

FIG. 4 shows an equivalent circuit diagram of a coupling device according to the present invention. The arrangement is rather similar to the circuit arrangement as explained as an example with reference to FIG. 1. Thus, the same reference signs denote similar and/or identical components and a repeated explanation thereof is dispensed with.

Figure 1:
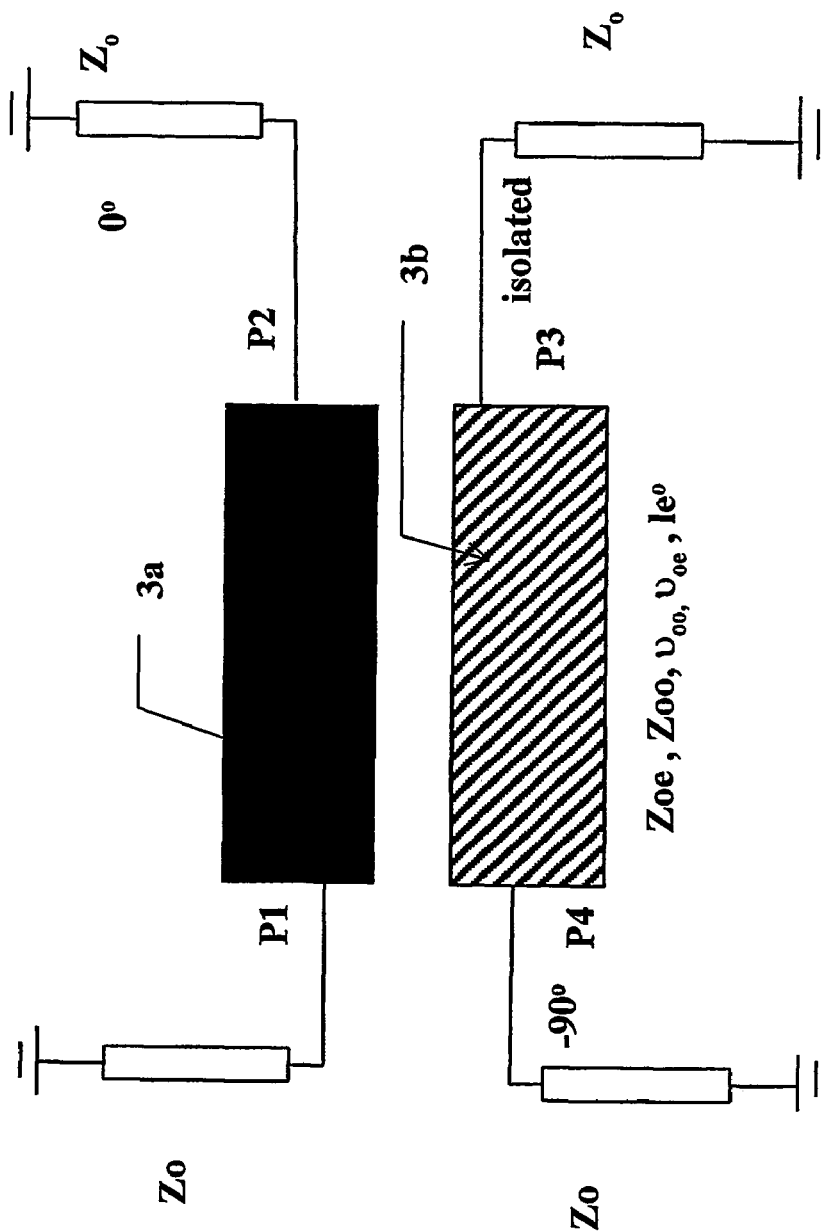
FIG. 1 shows an equivalent circuit diagram of a conventionally known coupler.

The difference between the equivalent circuits shown in FIG. 1 and FIG. 4 resides in that in the circuit according to FIG. 4, grounded capacitors C1 through C4 are connected at the output ports P1 to P4, respectively. With the values of capacitance of the capacitors C1 to C4 being properly chosen, the phase velocity mismatch between odd and even modes can be compensated for, i.e. equalized. The proper values of capacitance of the capacitors C1 to C4 depend on the degree of velocity mismatch. These proper values are determined before manufacturing on the basis of e.g. simulation results of the coupler based on the other known parameters of the coupler device.

Note that although FIG. 4 shows four capacitors, according to the present invention it is not necessarily the case that four capacitors are connected. Rather, at least one capacitor (C1, C2, C3, C4) is connected to a first end (i.e. at one of ports P1, P2 or P3, P4) of at least one of said at least two lines 3a, 3b, and grounded. It is also to be noted that the present invention is not limited to λ/4 line lengths but may be applicable to all conceivable coupling line lengths such as for example λ/2 or 3λ/4.

Note also that the capacitors, upon manufacturing the device, are only adapted to be grounded, i.e. connectable to ground, while the respective actual connection to ground is established only when operating the device.

Figure 2:
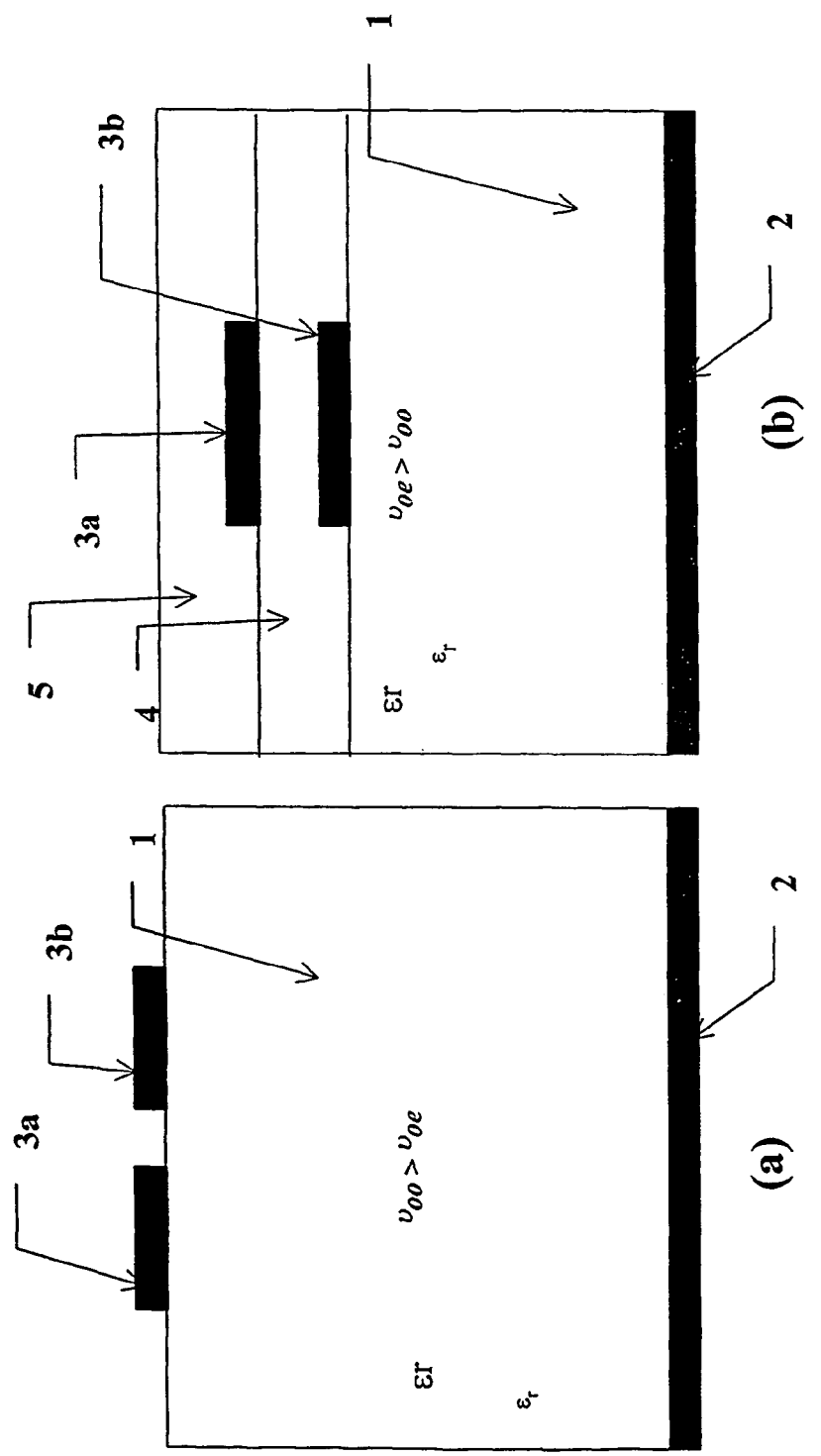
FIG. 2 shows a cross section of a coupler as represented in FIG. 1, with FIG. 2 showing coupled lines on the surface of (FIG. 2) or embedded (FIG. 2b) within a substrate.
Figure 3A:
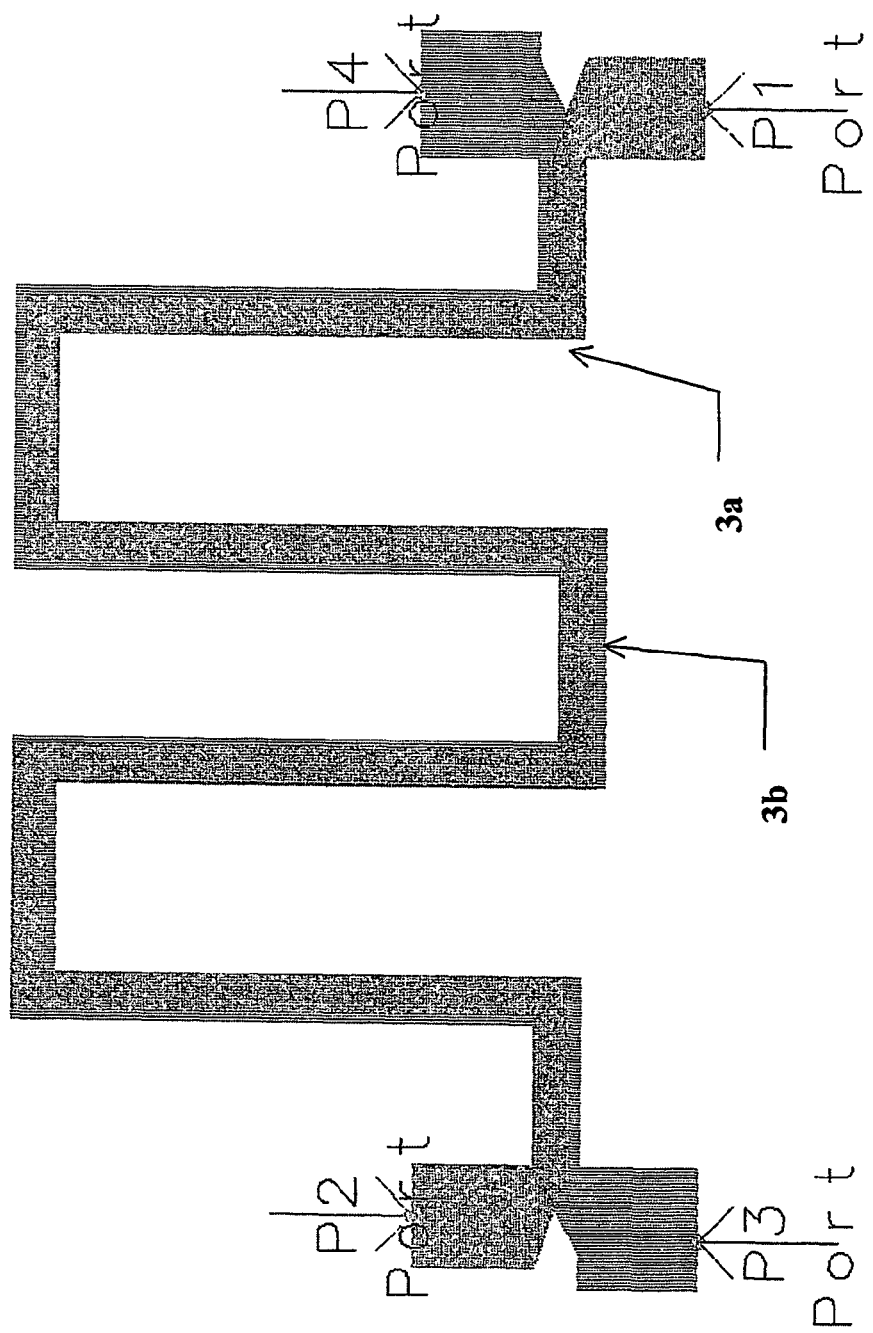
FIG. 3A shows a layout (top view) of a coupling device according to a modification of the coupler shown in FIG. 2(b)
Figure 3B:
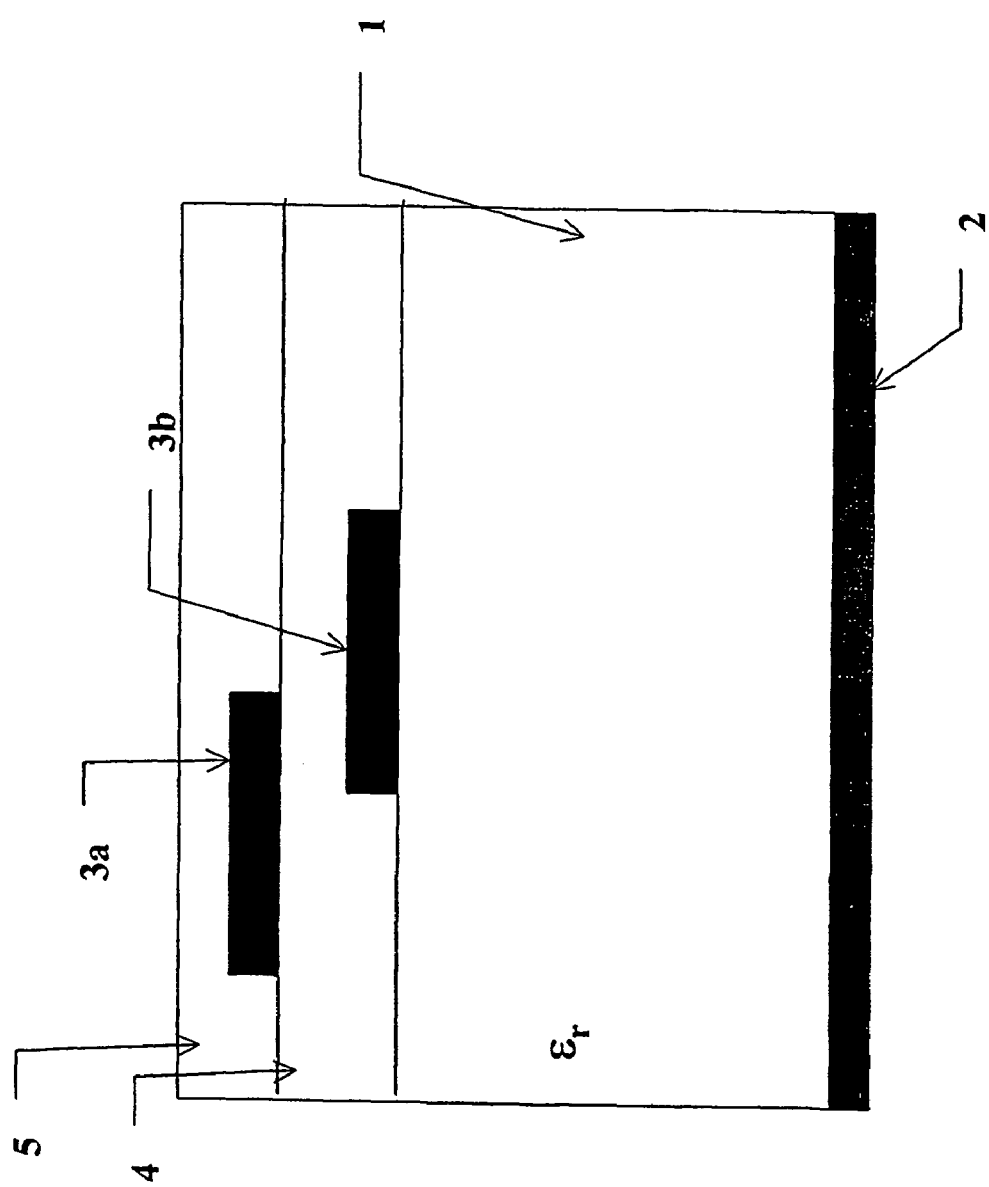
FIG. 3B shows a cross section of a coupler as represented in its layout in FIG. 3A.

As mentioned beforehand, FIG. 2 shows the typical structural cases in which unequal phase velocities (which have to be compensated) may occur. FIG. 2(b) is a specific case of the arrangement generally shown in FIG. 3B. This will serve as an example to which the proposed novel technique according to the present invention will be applied. The present invention being for example applied to such a broadside coupled microstrip structure as shown in FIG. 3B, is shown in FIG. 5B.

Figure 5A:
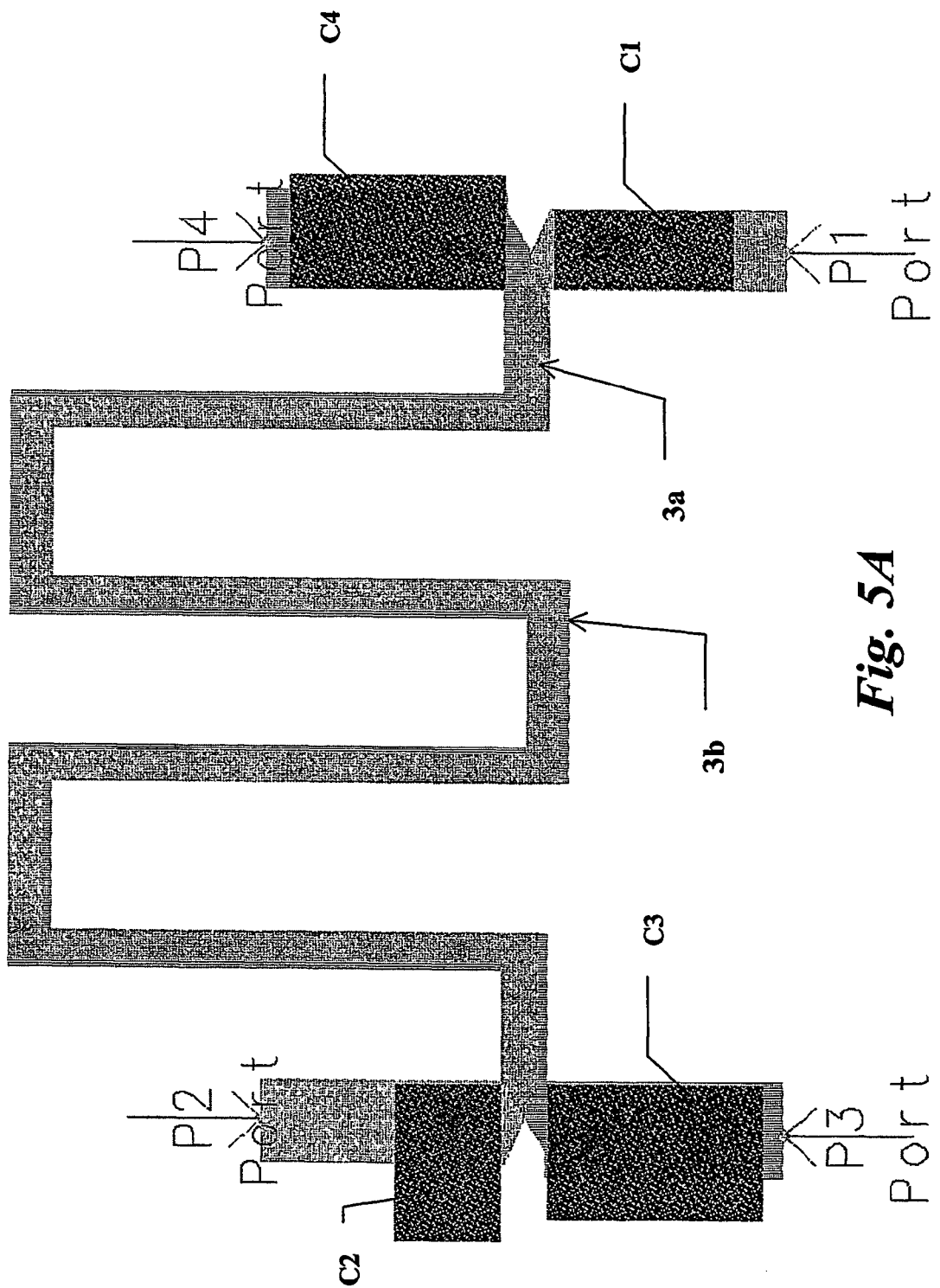
FIG. 5A shows a layout (top view) of a coupling device according to the present invention as shown in FIG. 4.
Figure 5B:
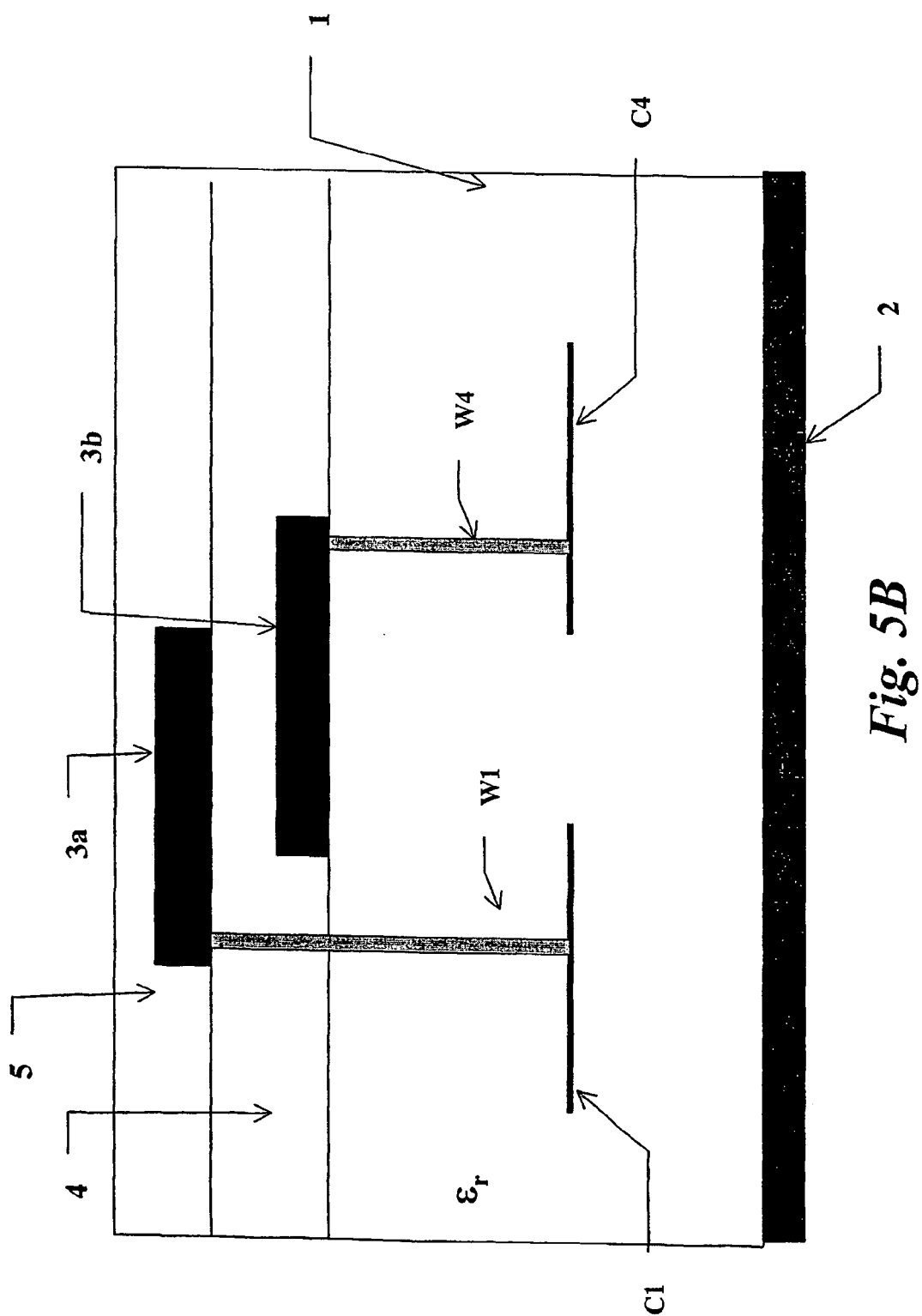
FIG. 5B shows a cross sectional view through the ports P1–P4 of the coupling device shown in FIG. 5A.

FIG. 5B shows a cross sectional view through the ports P1–P4 of the coupling device shown in FIG. 5A. FIG. 5A shows a layout (top view) of a coupling device according to the present invention as shown in FIG. 4.

Generally, the broadside coupled microstrip structure is a very useful design structure that can adjust the amount of coupling by the amount of offset between the two microstrip lines. (For example, it may roughly be said to be adjusted to its maximum coupling degree in case of no offset (see FIG. 2(b)) and be adjusted towards its minimum coupling degree with increasing offset). Nevertheless, although as an example only the present invention is applied to a structure as shown in FIG. 3B, resulting in an arrangement shown in FIG. 5B, it is to be noted that the present invention may also be applied to structure as shown in FIG. 2(b), or a combination of the structures illustrated in FIGS. 2(b) and/or 3B (the combined structure then having at least three coupling lines).

In FIG. 5B the same reference signs denote the same or like components as in the previous Figures. The difference between FIG. 5B and FIG. 3B resides in the provision of buried capacitors C1, C4. More precisely, C1 and C4, respectively, in FIG. 5B denote a conductive member embedded in said substrate 1 and facing said conductive layer 2 covering said first surface of said substrate 1. The conductive member may be any suitable conductive member that may have been applied for example by suitable lithography techniques to the substrate 1 and was thereafter buried by additionally applied substrate material. Note that the conductive member may be provisioned by depositing conductive material in the desired shape for the member using known deposition processes such as CVD (Chemical Vapor Deposition) or PVD (Physical Vapor Deposition) processes, or using known (thin or thick) film printing processes applying e.g. a conductive paste, or by using selective etching processes etching away excess parts of a conductive member, etc. Generally, it should be noted that the present invention is not restricted to any particular multilayer process but that any suitable multilayer process technology may be used.

Each of such members is connected by means of a respective electrical connection W1, W4 from said first end (i.e. port P1, P4) of said at least one of said (at least) two lines 3a, 3b to said conductive member C1, C4. Such a connection may be established by providing a via hole connection.

Note that the capacitance of said capacitors (C1 to C4) is determined by the area of said conductive member C1, C4, the distance between said conductive member C1, C4 and said conductive layer 2 covering said first surface of said substrate 1, and the dielectric constant $\in_r$ of said substrate 1 there between. It is to be noted that although the members C1 and C4 in FIG. 5B are shown to be equally spaced apart from the conductive layer 2, it is also conceivable that according to the required capacitance value required for a specific case, the members C1, C4 may be located at different distances from the conductive layer 2. In such a case, however, the production would require more production steps. (If e.g. all four conductive members involved in constituting the capacitors in the chosen example are at the same distance from the conductive layer, one production sub-cycle for providing the members is needed, while if all four conductive members involved in constituting the capacitors are at a different distance from the conductive layer, four such production sub-cycles for providing the members are needed.)

Note that the coupling line 3a in FIG. 5B need not necessarily be covered by a cover layer 5, but that the cover layer 4 covering coupling line 3b and separating the coupling lines 3b, 3a from each other in vertical direction, could be sufficient. Further, cover layers 4 and/or 5 may be of the same material as the substrate 1, but are not limited to such a material so that the multilayer arrangement may comprise layers (substrate/cover layer(s)) of different dielectric constants, if appropriate. Even the cover layers 4 and 5 may be of different material's each of which differs from the substrate material.

Figure 5C:
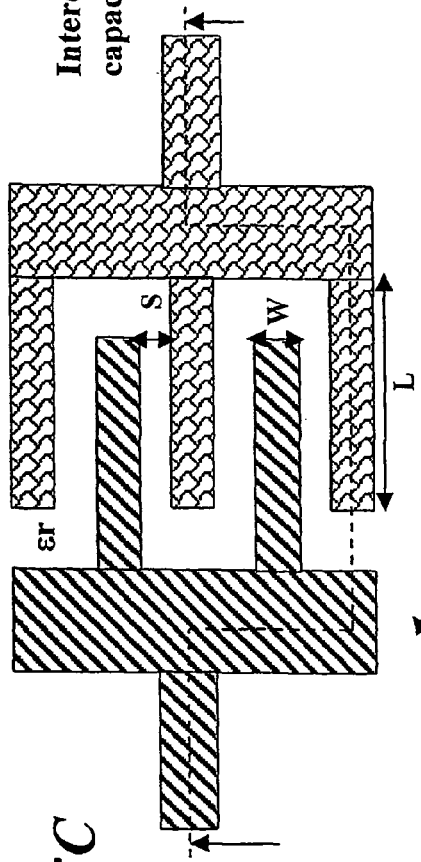
FIG. 5C shows a top view on an alternative capacitor implemention.

FIG. 5C illustrates an alternative for implementing a capacitor according to the present invention. There are two common forms of capacitors that are practically used in real implementation of the coupling device according to the present invention. One is referred to as a parallel plate capacitor as explained above in connection with FIG. 5B, while the other is named an "interdigitated" capacitor (see FIG. 5C). The interdigitated capacitor may particularly be used to achieve small value capacitors. As shown in FIG. 5C, its capacitor value is primarily defined by the number of fingers it has (N), the width of each finger (W), the separation between each finger (S), the length of each finger (L), and the dielectric constant (εr) of the substrate. One part of the conductive member constituting an interdigitated capacitor is connected, e.g. by means of a via hole connection, to the conductive layer 2 serving as a ground plane in operation of the coupling device. Note that the interdigitated capacitor, i.e. its two interdigitated parts are located in one plane.

Figure 5D:
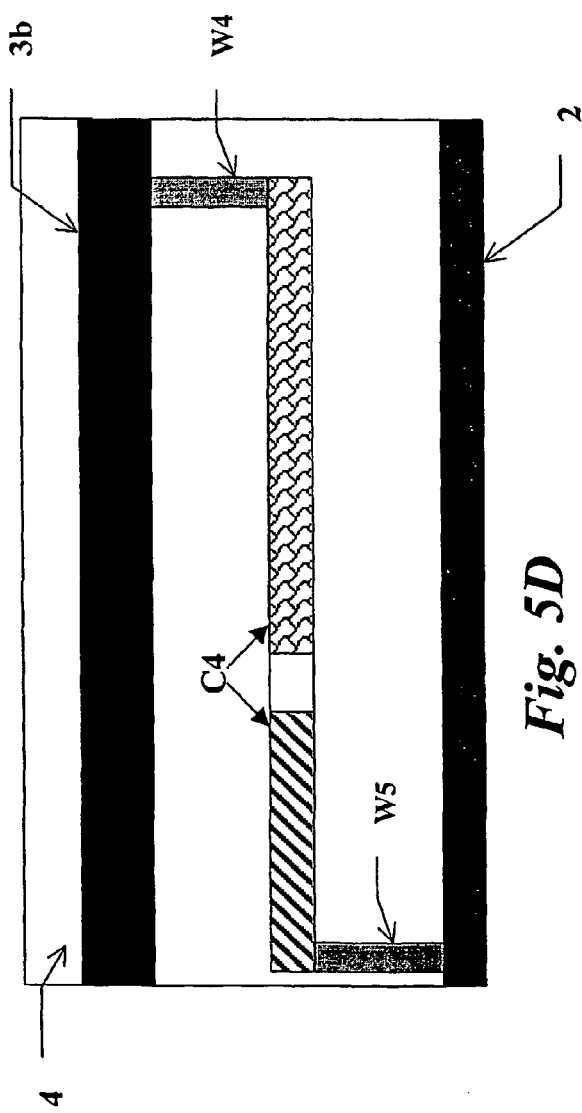
FIG. 5D shows a cross sectional view of such an alternative capacitor implementation being incorporated in the coupling device

FIG. 5D shows a partly cross section through the interdigitated capacitor of FIG. 5C along the dashed line in FIG. 5C, when such a capacitor is connected to a coupling line in a substrate. Same reference numerals denote the same or like components as in the previous Figures. FIG. 5D thus illustrates an example case in which capacitor C4 is realized as an interdigitated structure, one part thereof being connected with via connection W4 to line 3b while the other part thereof being connected by means of another connection W5 (via hole connection) to the conductive layer 2. Note that one or more or even all capacitors may be interdigitated capacitors and may also be used in combination with one (or more) parallel plate capacitor(s). Note that FIG. 5D only shows a part of the entire coupling structure and for example cover layer 5 and line 3a are omitted from the representation in FIG. 5D. Also, the scale in FIG. 5D may deviate from a drawing scale used in other figures. Additionally, the coupling device is not shown in its entire length but only its region at port P4 is shown.

Since the capacitors (conductive members) are below the structure of the microstrip lines 3a, 3b, the area of the circuit is not increased. The capacitors are effectively being created monolithically within the multilayer structure and there is no need to use SMD capacitive components that would adversely affect the performance. The circuit can be designed as a whole, thus electromagnetically guarantying its performance.

5A shows a layout (top view) of a coupling device according to the present invention. FIG. 5A is substantially similar to FIG. 3A with the exception that the conductive members C1, C4 constituting the capacitors C1, C4 (in FIG. 5B) and the conductive members C2, C3 are additionally shown. Note that the coupling lines 3a, 3b are designed as a meander type line in order to further decrease the required area for the coupling device.

The present inventors have manufactured prototypes of embedded broadside coupled line 90° (λ/4) coupling devices and measured their performance in order to validate the proposed technique. One coupling device (see FIGS. 3A, 3B) was fabricated without the present invention being implemented, while the other was fabricated with the present invention being implemented (see FIGS. 5A, 5B)

Figure 6A:
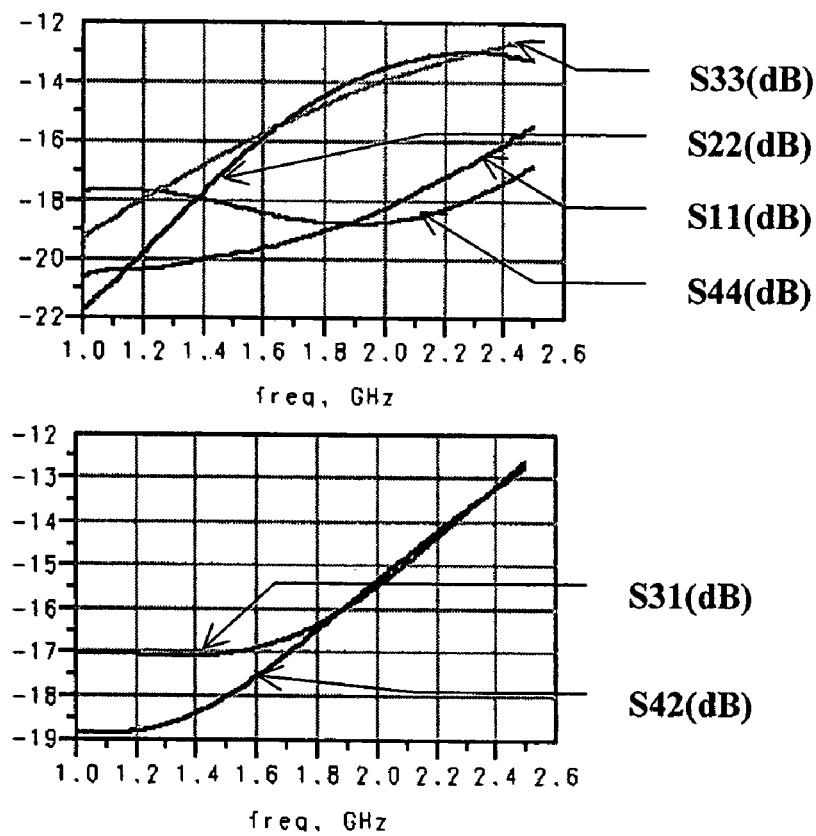
Figure 6B:
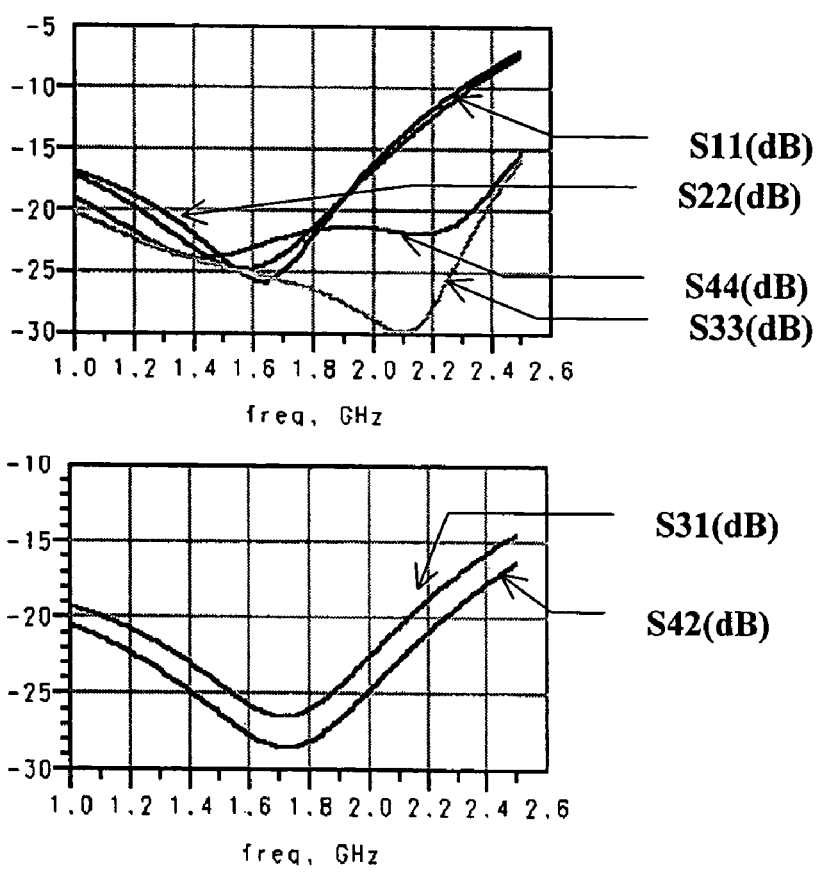
FIG. 6B shows a plot of measurement results for a coupling device according to the present invention.
Figure 7:
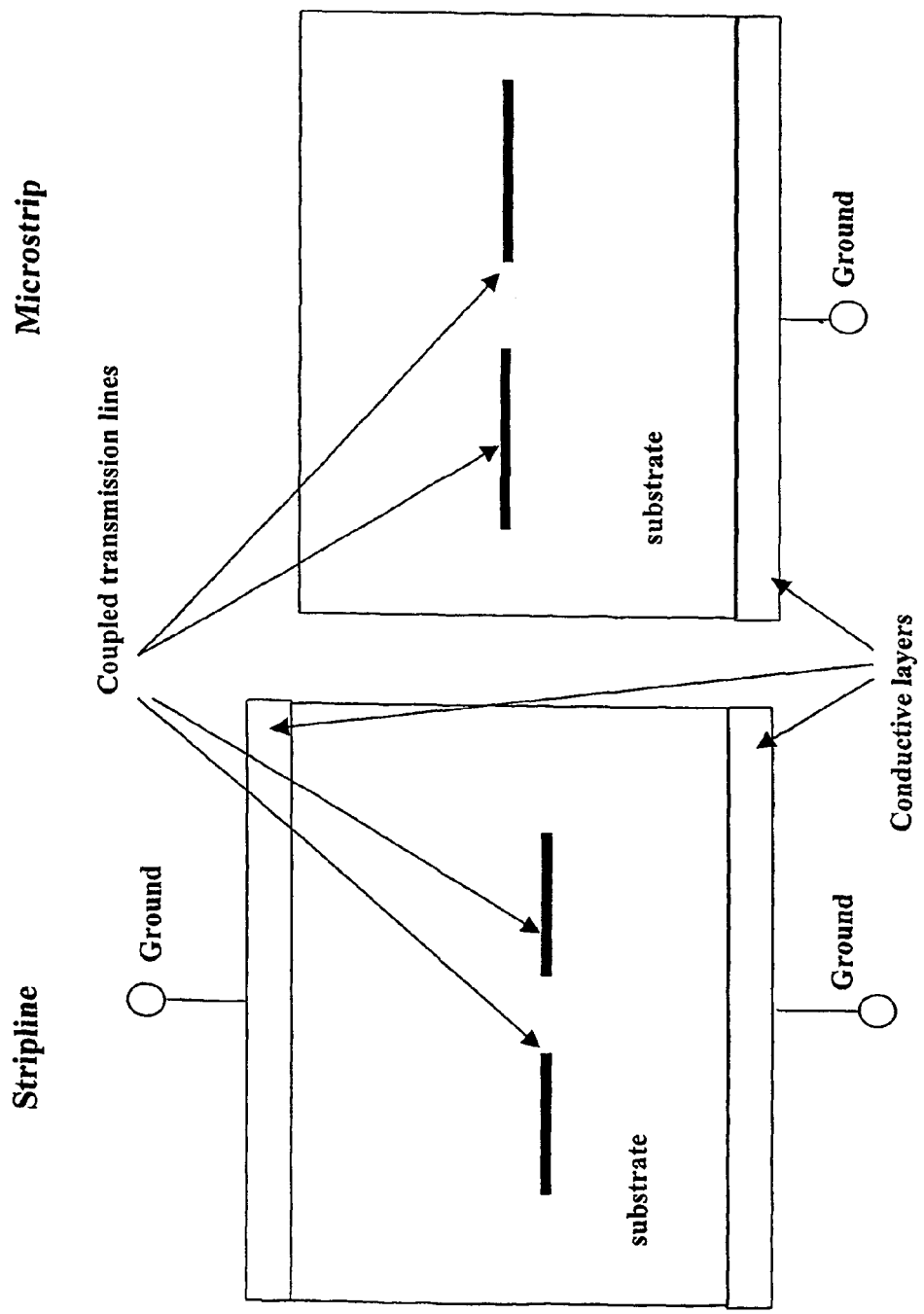
FIG. 7 shows a structural comparison between basic stripline and microstrip coupler device arrangements.

In FIG. 6 the S-parameter responses S1, S22, S33, S44 (in dB) of the input return loss at each of the four ports P1 to P4 are plotted versus frequency (in GHz). This is shown in the respective upper plot of FIGS. 6A and 6B. The input return loss is the ratio between the energy returned at a port i and the energy input at said port i. (In the chosen examples described herein, i ranges from i=1 to 4). Also, in the respective lower plots of FIGS. 6A and 6B, the S-parameter responses S31 and S42 of the through parameters (in dB) are plotted versus frequency (in GHz). The through parameter $S_{ki}$ is the ratio of the energy output at a port k when input at a port i. (Note that port P3 is isolated from port P1, while also port P4 is isolated from port P2) Both couplers were designed to operate in the 1750 MHz frequency range, and the results on isolation and matching for the two cases are presented in FIGS. 6A and 6B, respectively. It may be seen from FIG. 6A that the uncompensated coupler offers low performance that would be not acceptable in practical applications while the compensated novel coupler (FIG. 6B) offers superior performance with better than −22 dB matching at all ports and better than −26 dB isolation.

Accordingly, as has been described herein above, the present invention proposes a coupling device, comprising a substrate 1, a conductive layer 2 covering a first surface of said substrate 1, at least two electromagnetically coupled lines 3a, 3b being provided opposite to said first surface and at least one thereof being covered by at least one cover layer 4, 5, wherein at least one capacitor C1, C2, C3, C4 is connected between a first end of at least one of said at least two lines 3a, 3b and said conductive layer 2. The at least one capacitor is a buried capacitor grounded in order to equalize unequal phase velocities otherwise degrading the performance of e.g. broadside coupled structures in an inhomogeneous substrate structure such as for example microstrips in a multilayer LTCC. Therefore the present invention enables coupling devices having a high performance and offering in that way the best of all possible design scenarios in terms of wideband performance, size and cost.

Although the present invention has been described herein above with reference to its preferred embodiments, it should be understood that numerous modifications may be made thereto without departing from the spirit and scope of the invention. It is intended that all such modifications fall within the scope of the appended claims.

What is claimed is:

1. A coupling device, comprising:
   a substrate,
   a conductive layer covering a first surface of said substrate,
   at least two electromagnetically coupled lines being provided opposite to said first surface and at least one thereof being covered by at least one cover layer, characterized in that
   at least one capacitor is connected between a first end of at least one of said at least two lines and said conductive layer, wherein said capacitor is constituted by
   a conductive member embedded in said substrate and facing said conductive layer covering said first surface of said substrate, and
   an electrical connection from said first end of said at least one of said at least two lines to said conductive member.

2. A coupling device according to claim 1, wherein said at least two lines are arranged at different distances from said first surface of said substrate.

3. A coupling device according to claim 2, wherein
   a difference between the distances in which said at least two lines are arranged from said first surface of said substrate is determined by a thickness of a first cover layer covering a first line of said at least two lines.

4. A coupling device according to claim 2, wherein
   a first line and a second line of said at least two lines are arranged such that they at least partly overlap each other.

5. A coupling device according to claim 3, further comprising:
   a second cover layer arranged to cover at least a second line of said at least two lines.

6. A coupling device according to claim 4, wherein
   the amount of overlap adjusts the degree of electromagnetic coupling between said at least two lines.

7. A coupling device according to claim 1, wherein said connection is a via connection.

8. A coupling device according to claim 1, wherein the capacitance of said capacitor is determined by the area of said conductive member, the distance between said conductive member and said conductive layer covering said first surface of said substrate, and the dielectric constant of said substrate.

9. A coupling device according to claim 1, wherein said at least one cover layer is of the same material as said substrate.

10. A coupling device according to claim 1, wherein said substrate is made of a dielectric material.

11. A coupling device according to claim 1, wherein said conductive layer is connectable to ground potential.

* * * * *